(12) United States Patent
Kaji (10) Patent No.: US 7,872,232 B2
(45) Date of Patent: Jan. 18, 2011

(54) ELECTRONIC MICROSCOPE APPARATUS

(75) Inventor: Kazutoshi Kaji, Hitachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 200 days.

(21) Appl. No.: 12/354,174

(22) Filed: Jan. 15, 2009

(65) Prior Publication Data
US 2009/0194691 A1    Aug. 6, 2009

(30) Foreign Application Priority Data
Jan. 16, 2008    (JP)    .............................. 2008-006557

(51) Int. Cl.
*G01N 23/00*    (2006.01)
*G21K 7/00*    (2006.01)
(52) U.S. Cl. .................. 250/311; 250/305; 250/306; 250/307; 250/310; 250/397; 250/398
(58) Field of Classification Search ......... 250/305–307, 250/310, 311, 397, 398; 850/7, 19
See application file for complete search history.

(56) References Cited

U.S. PATENT DOCUMENTS

| | | | |
|---|---|---|---|
| 6,703,613 B2 * | 3/2004 | Kaji et al. ................... | 250/305 |
| 6,794,648 B2 | 9/2004 | Kaji et al. | |
| 7,067,805 B2 * | 6/2006 | Kajl et al. ................... | 250/305 |
| 7,250,601 B2 * | 7/2007 | Kaji et al. ................... | 250/305 |
| 2006/0011836 A1 | 1/2006 | Kaji et al. | |

FOREIGN PATENT DOCUMENTS

| | | |
|---|---|---|
| JP | 2002-056798 | 2/2002 |
| WO | WO 00/41206 | 7/2000 |
| WO | WO 03/038418 A1 | 5/2003 |

* cited by examiner

*Primary Examiner*—Jack I Berman
*Assistant Examiner*—Meenakshi S Sahu
(74) *Attorney, Agent, or Firm*—McDermott Will & Emery LLP (57) ABSTRACT

To enable measurement of an elastically scattered electron image, a characteristic-X-ray-based element image and an electron-beam-energy-spectroscopy-based element image with a high S/N and high spatial resolution in an electronic microscope having a function to produce an element image. Measurement of a characteristic X-ray signal and electron beam energy loss spectra or measurement of a plurality of energy filter signals including a core loss of an observed element is performed simultaneously and continuously with detection of elastically scattered electrons transmitted through a specimen to be analyzed, and element images based on characteristic X-rays and electron beam energy spectroscopy are added up while correcting a positional misalignment with respect to elastically scattered electron images continuously observed (see FIG. 1).

15 Claims, 8 Drawing Sheets

A : First embodiment              B : Second embodiment

Difference between data measured
in first embodiment and data measured in second embodiment

FIG. 5

Example of EELS spectra at material positions

A: Z-contrast image    B: Energy filter image    C: Z-contrast image × Energy filter image

FIG. 8

ELECTRONIC MICROSCOPE APPARATUS

BACKGROUND OF THE INVENTION

1. Field of the Invention

The present invention relates to an electronic microscope apparatus having a function to measure an element image of a specimen.

2. Background Art

As a result of making semiconductor elements and magnetic head elements finer and smaller in size, such elements have a structure in which thin films of several nanometers are stacked in a region on the submicron order. In the development of elements, it is important to analyze the structure of such a minuscule region and an element distribution in such a region. Devices for performing elemental analysis include a characteristic X-ray spectrometer and an electron beam energy analyzer (also called an energy filter), which are attached to transmission electron microscopes (TEM) or scanning transmission electron microscopes (STEM) for observing and designating a minuscule region.

In a case where an element image with a good S/N is observed by using a characteristic X-ray spectrometer or an electron beam energy loss spectrometer, a method of improving the signal intensity by increasing the observation time is ordinarily used. However, if the observation time is increased, a specimen drift caused in the observation time causes a deterioration of the resolution of the element image. As a method for solving this resolution deterioration problem, a method described in JP Patent Publication (Kokai) No. 2002-56798 for example should be mentioned.

Figure 8:
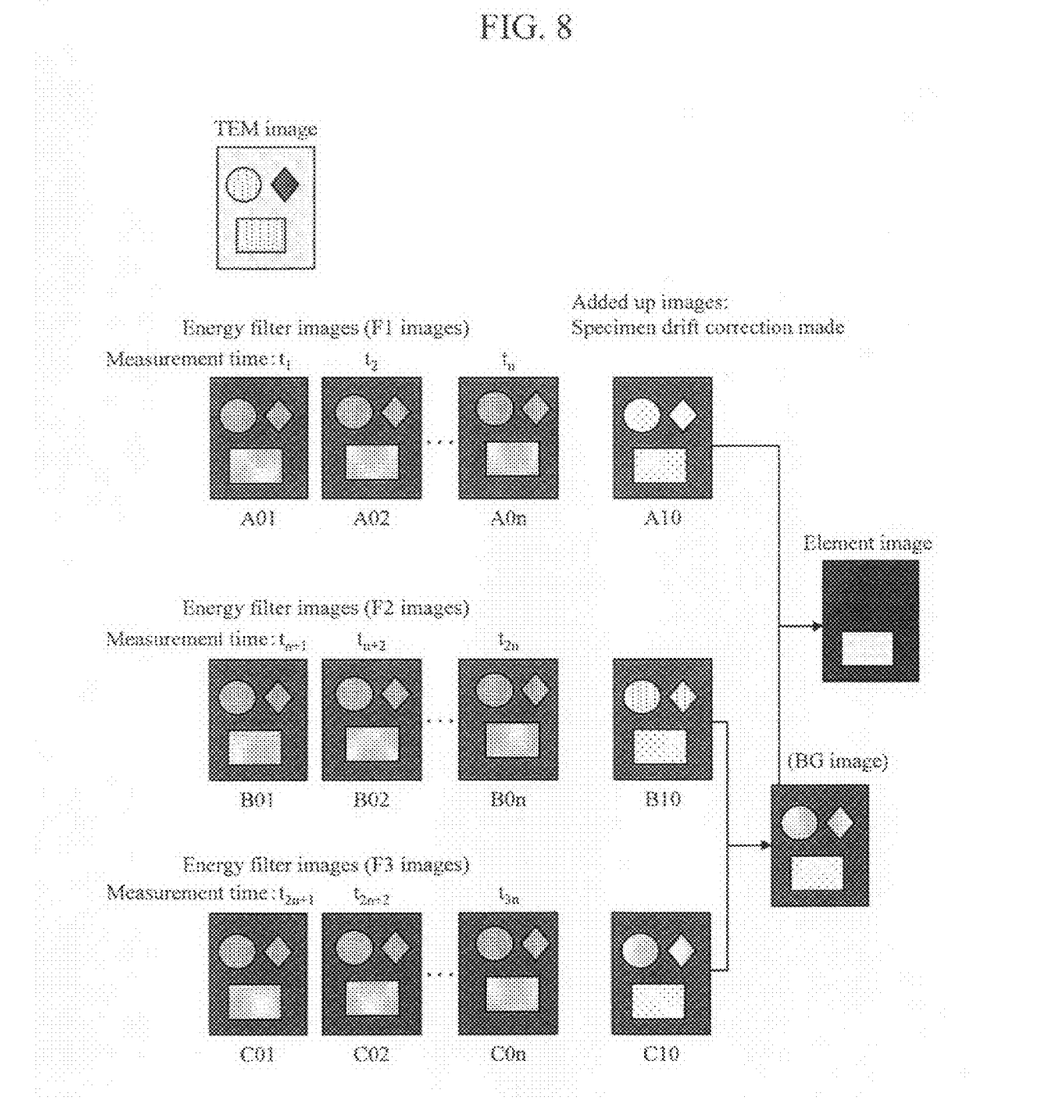
FIG. 8 is a diagram showing an example of observation of energy filter images with an electron beam energy analyzer attached to a TEM and a method of obtaining an element image in the conventional art.

According to the method described in JP Patent Publication (Kokai) No. 2002-56798, in a case where an electron beam energy loss spectrometer is attached to a TEM, an energy filter image including a core loss (core electrons) (hereinafter referred to as "F1 image"), and energy filter images based on lower-loss energy electrons (hereinafter referred to as "F2 image" and "F3 image") are obtained, as shown in FIG. 8. Also, an f1($t_1$) image, an f1($t_2$) image, ... and an f1($t_n$) image are added up by observation at different times to obtain an F1 image. Similarly, an f2($t_{n+1}$) image, an f2($t_{n+2}$) image, ... and an f2($t_{2n}$) image are added up to obtain an F2 image. Further, an f3($t_{2n+1}$) image, an f3($t_{2n+2}$) image, ... and an f3($t_{3n}$) image are added up to obtain an F2 image. Thereafter, an image formed only of an F1 image background signal (hereinafter referred to as "BG image") is computed by using the F2 image and the F3 image, and the BG image is subtracted from the F1 image to obtain an element image. As a computation method, a three-window method disclosed in "Electron Energy Loss Spectroscopy in the Electron Microscope" written by Egerton may be used.

SUMMARY OF THE INVENTION

According to JP Patent Publication (Kokai) No. 2002-56798, however, the f1($t_1$) image, f1($t_2$) image, ... and f1($t_n$) image are added up while correcting a misalignment of the f1($t_2$) image with reference to the f1($t_1$) image. Of the f1 image in this case, a signal to noise ratio (S/N) enabling identification of a positional misalignment is required. To obtain the F1 image with a sufficient S/N, the observation time is increased. If a specimen drift occurs during the observation time, the spatial resolution of the element image deteriorates in comparison of a TEM image (example) observed in a shorter time period. JP Patent Publication (Kokai) No. 2002-56798, however, contains no description of any solution to the problem. Also, JP Patent Publication (Kokai) No. 2002-56798 contains no description of use of any device alternative to the energy filter image for computation of the amount of misalignment of the image.

For element image observation by means of characteristic X-rays, a method called spectral imaging is ordinarily used. This method is carried out in a case where a characteristic X-ray spectrometer is attached to a STEM. A specimen is scanned with an electronic beam and characteristic X-rays generated from the specimen per pixel is analyzed. However, the intensity of detected characteristic X-rays is low and, therefore, there is a need to scan the specimen with the electron beam for several ten minutes to several hours. Because a long time is thus required for measurement, a specimen drift correction is made by using an elastically scattered electron image and it is necessary to intermit measurement of characteristic X-rays several times to several ten times. A specimen drift during characteristic X-rays measurement causes a deterioration of the spatial resolution of the element image. With respect to this point, if the number of times a specimen drift correction is made is increased, the deterioration of the spatial resolution of the element image can be limited to a small degree, but the measurement time is further increased and a detriment such as damage to the specimen by the electron beam occurs.

Also, a characteristic X-ray spectrometer incorporated in an electronic microscope has a low detection signal intensity due to a solid angle constraint on a characteristic X-ray detector. That is, an electron beam energy loss spectrometer detects nonelastically scattered electrons, but the detection signal therefrom is weak because the nonelastic scattering sectional area is small. With respect to this point, the signal intensity can be improved by increasing the observation time in a case where an element image with a good S/N is observed by using a characteristic X-ray spectrometer or an electron beam energy loss spectrometer. However, if the observation time is increased, a problem arises that the resolution of the element image deteriorates as a result of a specimen drift generated in the observation time.

In summing up, a characteristic X-ray spectrometer incorporated in an electronic microscope has a low detection signal intensity due to a solid angle constraint on a characteristic X-ray detector. Also, an electron beam energy loss spectrometer has a low detection signal intensity because the nonelastic scattering sectional area is small. If the observation time is increased for observation of a high-S/N element image using the characteristic X-ray spectrometer or the electron beam energy loss spectrometer, there is a problem that the resolution of the element image deteriorates as a result of a specimen drift.

The present invention has been achieved in consideration of the above-described circumstances and an object of the present invention is to enable measurement of an elastically scattered electron image, a characteristic-X-ray-based element image and an electron-beam-energy-spectroscopy-based element image with a high S/N and high spatial resolution in an electronic microscope having a function to produce an element image.

To achieve the above-described object, in an electronic microscope apparatus according to the present invention, an electron beam is applied to the same irradiation position on a specimen for a predetermined time period; a plurality of time-divided elastically scattered electron images (Z-contrast images) are formed from elastically scattered electrons detected by an elastically scattered electron detector; and a plurality of first energy filter images (F1 images) including a core loss of an element to be observed and at least two sorts of second and third energy filter images (F2 and F3 images) of lower-loss energy in comparison with the first energy filter images are formed in a time division manner on the basis of outputs from an electron beam energy analyzer. Also, an amount of specimen drift is computed by using the plurality of elastically scattered electron images, adding-up is performed while correcting a specimen drift in the first to third energy filter images on the basis of the amount of specimen drift, and an element image (650 in FIG. 3) is formed with respect to the element to be observed on the basis of the first to third energy filter images drift-corrected and added up. More specifically, a background image is formed by using the F2 and F3 images drift-corrected and added up, and the element image is formed by subtracting the background image from the F1 images drift-corrected and added up.

The electronic microscope apparatus according to the present invention may be arranged so that a characteristic X-ray spectrum generated from the specimen by application of the electron beam is detected; a plurality of time-divided element images (201 to 20n in FIG. 2) are formed from the characteristic X-ray spectrum; and an element image of a high S/N (210 in FIG. 2) is formed by adding up while correcting a specimen drift in the plurality of element images on the basis of the amount of specimen drift computed.

Further, in the electronic microscope apparatus according to the present invention, element images (801 to 80n in FIG. 5) to be observed may be directly formed from an electron beam energy loss spectrum signal instead of using the energy filter images (F1, F2, and F3 images). That is, an amount of specimen drift is computed by using a plurality of time-divided elastically scattered electron images (Z-contrast images), and an element image of a high S/N (810 in FIG. 5) is formed on the basis of this amount of specimen drift by adding up while correcting a specimen drift in a plurality of element images directly obtained from electron beam energy loss spectra.

Also, in the electronic microscope apparatus according to the present invention, an electron beam is applied to the same irradiation position on a specimen for a predetermined time period; a plurality of time-divided elastically scattered electron images (Z-contrast images) are formed from elastically scattered electrons detected by an elastically scattered electron detector; and a plurality of first energy filter images (F1 images) including a core loss of an element to be observed and at least two sorts of second and third energy filter images (F2 and F3 images) of lower-loss energy in comparison with the first energy filter images are formed in a time division manner on the basis of outputs from an electron beam energy analyzer. Also, (if the resolution of the Z-contrast images is low) image computation is performed on the plurality of elastically scattered electron images and the plurality of F1 images at the same point in time, and an amount of specimen drift is computed by using a plurality of images (9001 to 900n in FIG. 6) obtained by the image computation. Also, adding-up is performed while correcting a specimen drift in the F1 to F3 images on the basis of the amount of specimen drift, and an element image to be observed (9010 in FIG. 6) is formed on the basis of the F1 to F3 images drift-corrected and added up.

Further features of the present invention will become apparent from the following best mode of carrying out the invention and the accompanying drawings.

Processing according to the present invention enables provision of an electronic microscope apparatus capable of measuring an elastically scattered electron image, a characteristic-X-ray-based element image and an electron-beam-energy-spectroscopy-based element image with a high S/N and high spatial resolution.

DESCRIPTION OF SYMBOLS

1 Electron beam source
2 Electron beam
3 Electron beam scanning coils
4 Objective lens
5 Specimen
6 Characteristic X-ray spectrometer
7 Projection lens or projection lens system
9 Z-contrast detector
10 Point light source
11 Electron beam
12 Multipole lens
14 Quadrupole lens
15 Energy dispersion portion
16 Electron beam detector
17 Energy dispersion surface
18 Drift tube
21 Controller
22 Electron beam energy analyzer
23 Computation section
24 Database section
25 Image/spectrum display portion
27 Memory section
28 Electron beam energy analyzer control section
29 Central control section
30 STEM control section
31 Input device

DETAILED DESCRIPTION OF THE PREFERRED EMBODIMENTS

The present invention relates to an electronic microscope apparatus having an elastically scattered electron detector, a characteristic X-ray spectrometer and an electron beam energy analyzer and, more particularly, to an electronic microscope apparatus capable of obtaining an elastically scattered electron image, a characteristic-X-ray-based element image and an electron-beam-energy-spectroscopy-based element image with a high S/N and high spatial resolution.

Embodiments of the present invention will be described with reference to the accompanying drawings. However, it is to be noted that the embodiments are only an example of implementation of the present invention, not limiting of the technical scope of the present invention. Constituents common to the diagrams are indicated by the same reference numerals.

First Embodiment (1) Configuration of Scanning Transmission Electron Microscope

Figure 1:
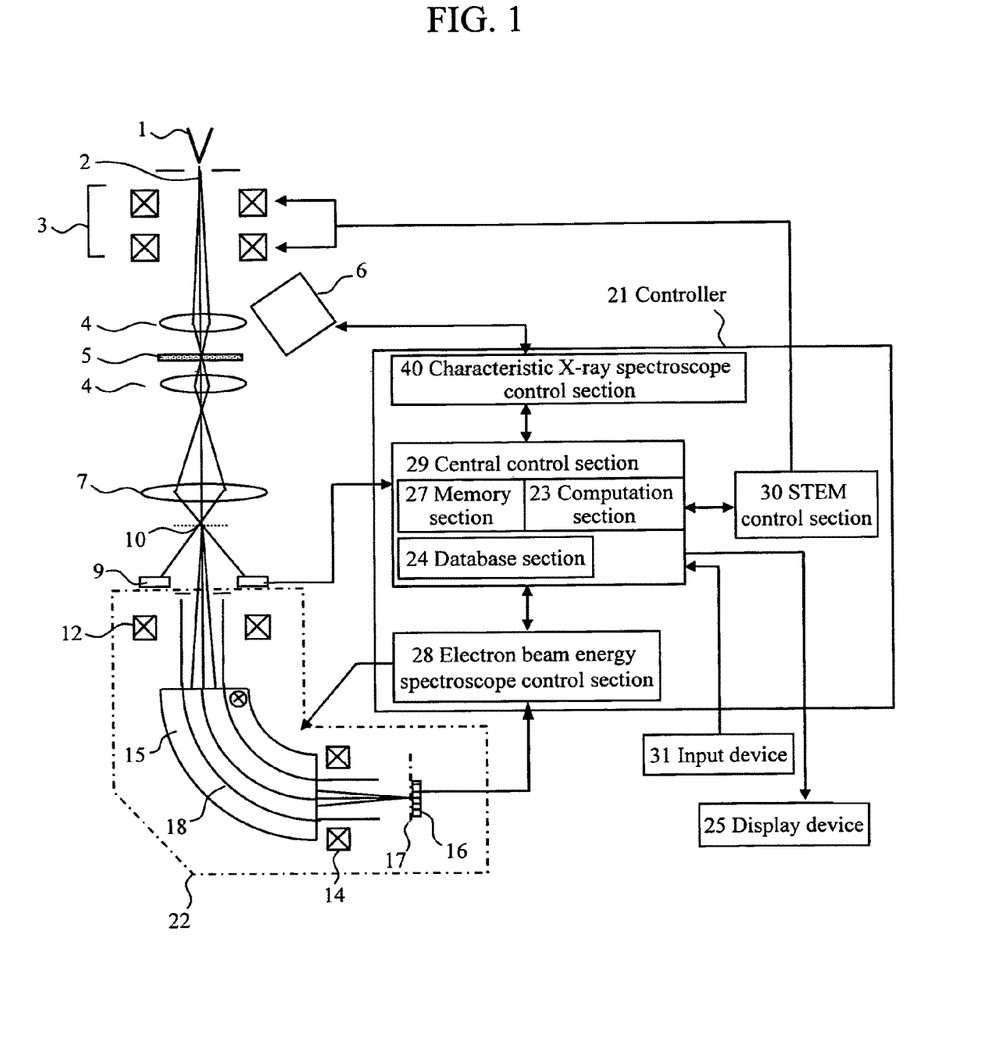
FIG. 1 is a diagram schematically showing an electron microscope apparatus common to embodiments of the present invention.

FIG. 1 is a diagram schematically showing a configuration of essential portions of a scanning transmission electron microscope (STEM) having a characteristic X-ray spectrometer and an electron beam energy analyzer (EELS) according to an embodiment of the present invention. This scanning transmission electron microscope is common to the embodiments.

An electron beam 2 generated in an electron beam source 1 forms a probe by means of an objective lens 4 and the probe is applied to a specimen 5. The position at which the electron beam is applied to the specimen 5 is deflected by electron beam scanning coils 3. Characteristic X-rays are generated from the specimen to which the electron beam is applied, and are detected by a characteristic X-ray spectrometer 6. The electron beam passing through the specimen 5 forms an object point 10 on an electron beam energy analyzer 22 by means of a projection lens 7. The electron beam then enters the electron beam energy analyzer 22 and the energy of the electron beam is analyzed by the electron beam energy analyzer 22 to measure an electron beam energy loss spectrum and observe an element distribution image. The electron beam energy analyzer 22 is constituted by an energy dispersion portion 15, a multipole lens 12 set on the upstream side of the energy dispersion portion 15, a quadrupole lens 14 set on the downstream side of the energy dispersion portion 15, an electron beam detector 16 which detects the energy-dispersed electron beam, and a drift tube 18 in which the energy of the electron beam is adjusted. Use of only one multipole lens 12 is not necessarily specified. A combination of a plurality of multipole lenses may be used.

A controller 21 is constituted by a STEM control section 30, an electron beam energy analyzer control section 28, a characteristic X-ray spectrometer control section 40 and a central control section 29. The STEM control section 30 is for controlling the electron beam position on the specimen so that the specimen is suitably scanned with the electron beam. The electron beam energy analyzer control section 28 controls electron beam energy analysis conditions in the electron beam energy analyzer 22, including an excitation condition for the energy dispersion portion 15, a focusing condition and an enlargement condition with respect to an electron beam energy loss spectrum and an applied voltage condition for the drift tube 18. A characteristic X-ray spectrometer control section 40 controls, for example, the range of energy of X-rays to be measured, the measurement time and a characteristic X-ray energy condition with respect to an element to be observed.

The central control section 29 includes a database section 24, a memory section 27 and a computation section 23. The database section 24 has, for example, information on elements to be measured, control parameters for detecting characteristic -X-rays from an observed element and control parameters for the electron beam energy analyzer. The memory section 27 stores, for example, a detection signal from a Z-contrast detector 9 for observing an elastically scattered electron image based on elastically scattered electrons (also called a Z-contrast image), a detection signal from the characteristic X-ray spectrometer 6 and a detection signal from the electron beam energy analyzer 22. The computation section 23 computes an amount of positional misalignment due to a specimen drift by adding up the detection signal from the Z-contrast detector 9, the detection signal from the characteristic X-ray spectrometer 6 and the detection signal from the electron beam energy analyzer 22 and by taking correlations between Z-contrast images obtained at predetermined time intervals (This computation is performed in a positional misalignment computation section in the computation section but the positional misalignment computation section is not shown in the figure). The computation section 23 also executes computation for obtaining an element image from the characteristic X-ray signal detected by the characteristic X-ray spectrometer. Further, the computation section 23 performs computation for obtaining an element image on the basis of energy filter images detected by the electron beam energy analyzer 22 and electron beam energy loss spectra detected by the electron beam energy analyzer 22 (see FIGS. 3 to 5).

The central control section 29 controls the operations of the STEM control section 30, the characteristic X-ray spectrometer control section 40 and the electron beam energy analyzer control section 28. An input device 31 through which an operator inputs (designates) an element to be measured, etc., and a display device 25 which displays electron beam energy loss spectra and element distribution images are connected to the central control section 29.

(2) Measurement of Electron Beam Energy Loss Spectra and Observation of Element Distributions with Electron Beam Energy Analyzer Description will next be made of the operation in the controller 21 at the time of electron beam energy loss spectrum measurement and element image observation with the electron beam energy analyzer 22.

When an operator inputs (designates) an element to be observed by using the input device 31, the central control section 29 derives the corresponding element information from the database section 24 and outputs measurement conditions specific to the element contained in the element information to the electron beam energy analyzer control section 28. The electron beam energy analyzer control section 28 controls the multipole lenses 12 and 14, the drift tube 18 and the energy dispersion portion 15 to cause the electron beam in the energy range including energy specific to the element to enter the electron beam detector 16. An electron beam intensity signal in each channel of the electron beam detector 16 is an electron beam energy loss spectrum. A detector having three channels may be used as described below. An electron beam of energy including a core loss of an observed element is detected through one of the channels, while electron beams of lower-loss energies in comparison with the core loss are detected through the other two channels. Energy filter images corresponding to the channels are observed. In a case where an element image is formed by using energy filter images, it is necessary that the electron beam detector 16 have at least two channels. That is, one channel is required for obtaining an energy filter image including the core loss and another channel is required for obtaining a filter image of lower-loss energy in comparison with the core loss.

The electron beam intensity signals from the electron beam detector 16 are stored in the memory section 27. The computation section 23 executes processings including background correction to spectrums, processing for correcting the grain of the electron beam detector, processings for adding up energy filter images and spectra and computation processing for obtaining element images from energy filter images and spectra. The spectra and element images after the computation are stored in the memory section 27 and displayed on the display device 25. By the above-described processings, the operator can obtain spectra and element distribution images.

The electron beam detector 16 is used not only for measuring electron beam loss spectra. For example, if the electron beam detector has two or more channels, electron beams entering the channels and differing in energy are simultaneously measured, corrections to the detector (e.g., the detector sensitivity correction and dark current correction) are made and computation is thereafter performed by using the electron beam intensities detected through the channels, thereby enabling observation of element distribution images. As a computation method, a two-window method or a three-window method described in the above-mentioned "Electron Energy Loss Spectroscopy in the Electron Microscope" written by Egerton can be used. The electron beam detector 16 is not limited to a unidimensional detector. For example, a two-dimensional electron beam detector such as a two-dimensional CCD may be used. In a case where such a beam detector is used, an electron-beam energy loss spectrum can be measured by adding up pixels in a direction perpendicular to the energy dispersion direction.

(3) Element Distribution Observation with Characteristic X-ray Spectrometer

Subsequently, description will be made of the operation in the controller 21 at the time of element image observation with the characteristic X-ray spectrometer 6.

When the operator inputs (designates) an element to be observed by using the input device 31, the central control section 29 derives the corresponding element information from the database section 24 and outputs measurement conditions specific to the element contained in the element information to the characteristic X-ray spectrometer control section 40. The characteristic X-ray spectrometer control section 40 controls the characteristic X-ray detection energy range and measurement time under the obtained measurement conditions so that the X-ray detector (not shown in FIG. 1) in the characteristic X-ray spectrometer 6 detects characteristic X-rays.

The detected characteristic X-rays are subjected to energy analysis to be stored as characteristic X-ray spectra and element distribution images in the memory section 27. At this time, the computation section 23 performs computation processing including adding up of element images. The spectra and element images after the computation are stored in the memory section 27 and displayed on the display device 25 (see element images (A) in FIG. 2). By the above-described processings, the operator can obtain spectra and element distribution images.

(4) High S/N Element Image Observation

Description will be further made of high S/N element image observation with the characteristic X-ray spectrometer 6 and the electron beam energy analyzer 22.

Figure 2:
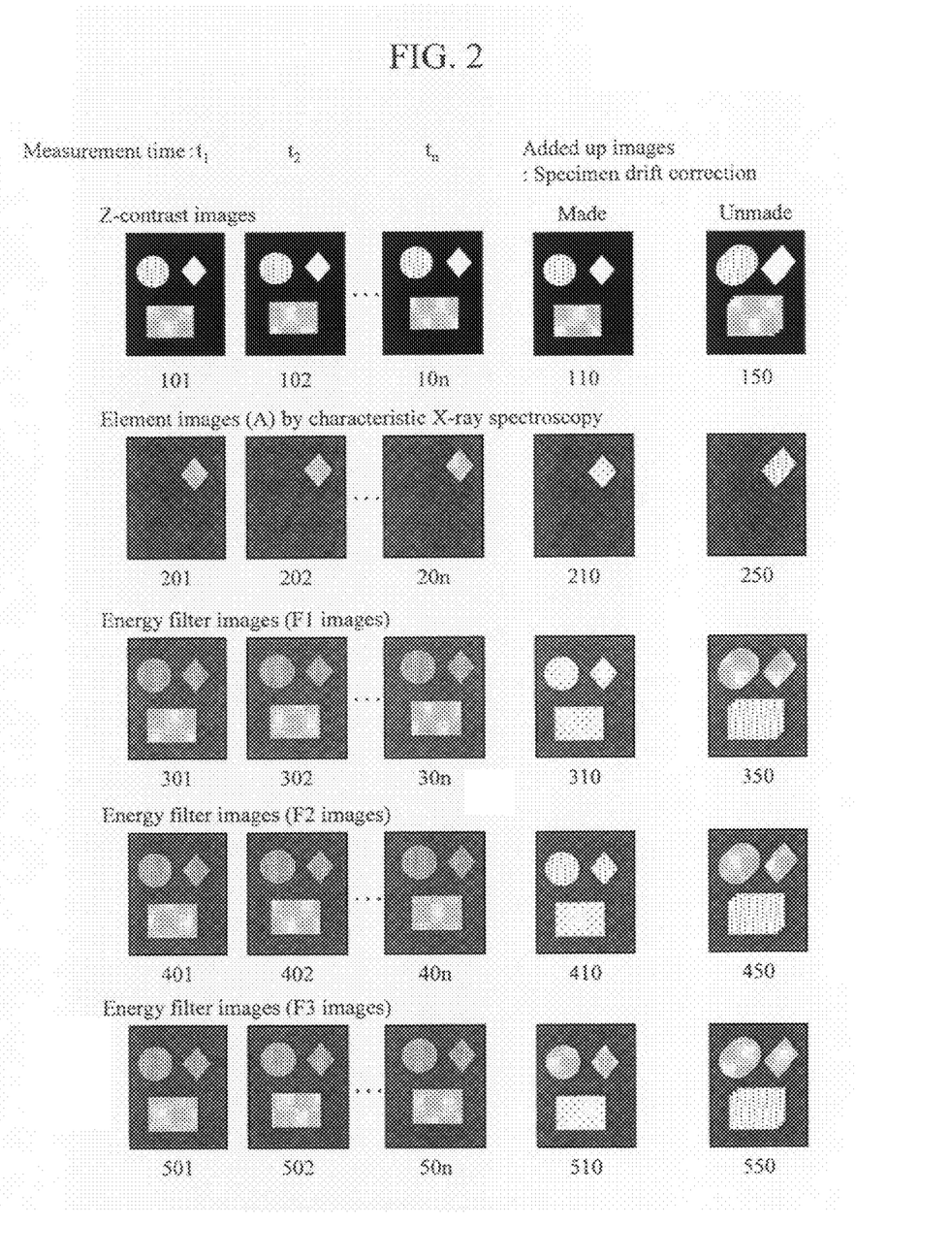
FIG. 2 is a diagram showing an example of observation of Z-contrast images, element images based on characteristic X-ray spectroscopy (A), and energy filter images (F1 image, F2 image, F3 image) based on electron beam energy spectroscopy in the first embodiment.

As shown in FIG. 2, elastically scattered electrons from the specimen 5 are detected as a Z-contrast image 101 in correspondence with the electron beam application position by the Z-contrast detector 9. Simultaneously with the Z-contrast image, an element image (A) 201 by the characteristic X-ray spectrometer and energy filter images (F1) 301, (F2) 401 and (F3) 501 by the electron beam energy analyzer are observed. These five sorts of images are formed on the basis of the results of detection of elastically scattered electrons, characteristic X-rays and energy-loss electrons with the detectors performed when the electron beam is applied to one place on the specimen. Thus, the five sorts of images represent the observation results with respect to the only one place.

In the same way as in the above, a plurality of images are successively taken in at predetermined time internals. That is, a plurality of time-division images of the same place are obtained. The obtained Z-contrast images are 102, . . . , 10n. Also, the obtained element images (A) are 202, . . . , 20n, and the obtained energy filter images are (F1) 302, . . . , 30n, (F2) 402, . . . , 40n, and (F3) 502, . . . , 50n. The total number n of images successively observed is not particularly specified. The number n can be set to a number necessary for obtaining high S/N images.

Figure 3:
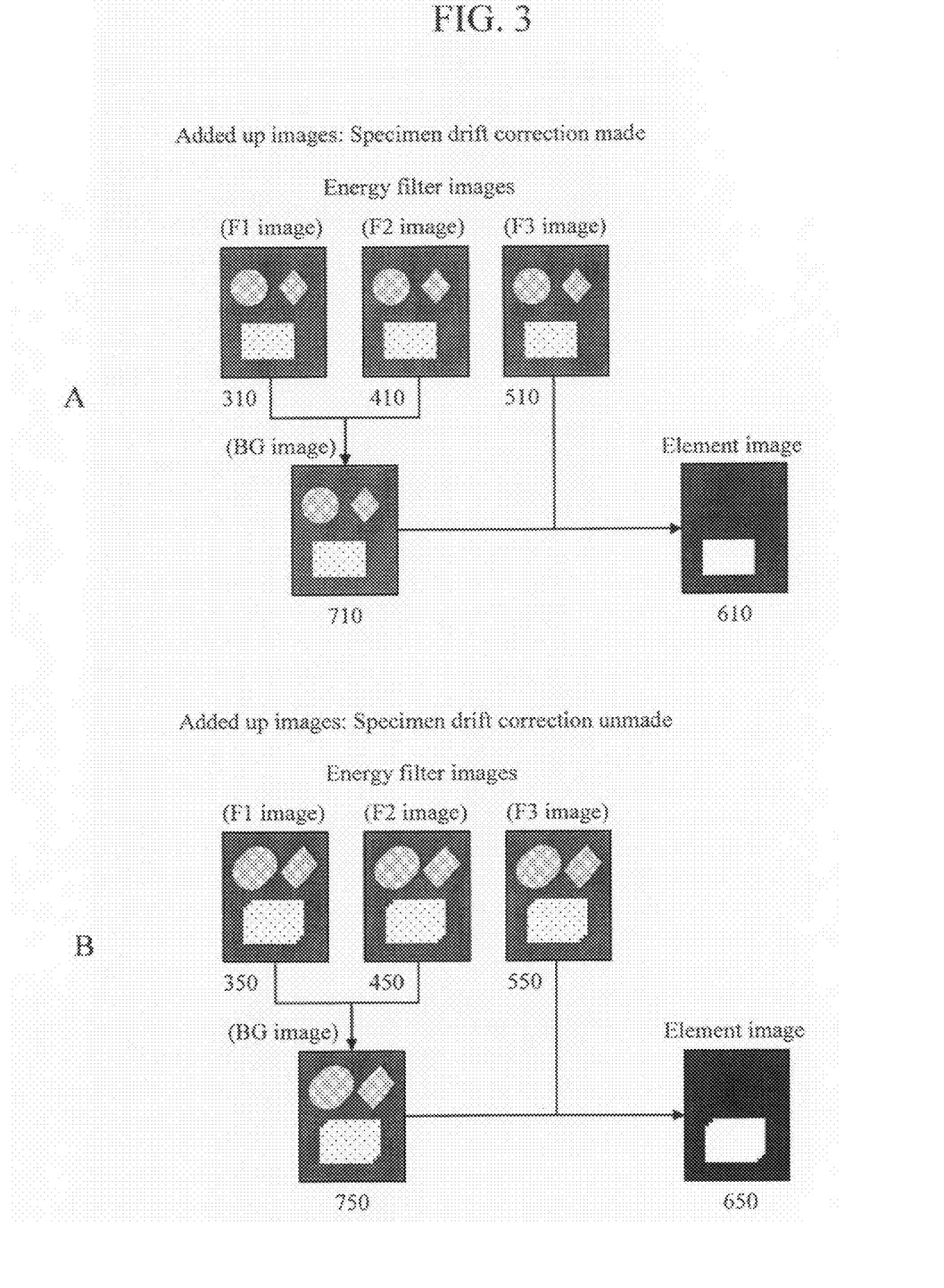
FIG. 3 is a diagram for outlining a method of obtaining an element image (C) on the basis of energy filter images in the first embodiment.

If a specimen drift occurs while the images are being successively observed, the observed objects (represented by ○, ◇, and □ in FIG. 2) are shifted by small amounts, as shown in FIG. 2. If the images are added up without correcting the specimen drift, a failure to correctly observe the shape of the observed object, as shown by a Z-contrast image 150, results. Also, in the element images (A) by the characteristic X-ray spectrometer, the spatial resolution deteriorates. Correspondingly, the energy filter images (F1, F2, F3) also deteriorate in spatial resolution. In this case, if an element image (C) is obtained by computation on the basis of the energy filter images without making any drift correction, the spatial resolution deteriorates, as shown in an element image (C) 650 in FIG. 3B. For the element image (C) 650 in this case, the three-window method described in the above-mentioned "Electron Energy Loss Spectroscopy in the Electron Microscope" written by Egerton can be used.

Then, the images are added up after correcting the specimen drift, thereby enabling observation of a Z-contrast image 110 and an element image (A) 210 without deteriorating the spatial resolution. To execute specimen drift correction, the amount of drift is computed by using the Z-contrast images (101 to 10n) and taking correlations between the images, and the amount of drift is reflected in each image. The reason for use of the Z-contrast images for specimen drift correction is that the Z-contrast images are higher in S/N than the element images (A) and the energy filter images with respect to the same observation time and are suitable for discrimination of a specimen drift. Also, since the element images (A) and the energy filter images are observed simultaneously with the Z-contrast images, the amount of positional misalignment of the specimen computed from the Z-contrast images can be directly obtained as the amount of positional misalignment common to the element images (A) and the energy filter images. Consequently, if the amount of positional misalignment obtained from the Z-contrast images is applied to the element images (A) and the energy filter images (F1, F2, F3), the element image (A) 210 and energy filter images 310, 410, and 510 can be observed without deteriorating the spatial resolution.

If the element image (C) is obtained by computation on the basis of such energy filter images, a high-resolution high-S/N element image such as an element image (C) 610 shown in FIG. 3A can be observed.

The method of computing the element image (C) is not limited to the three-window method. The two-window method may alternatively be used. In the two-window method, the element image (C) can be obtained by performing division of the energy filter image 510 by the energy filter image 410.

Second Embodiment (1) Difference from First Embodiment

Figure 4:
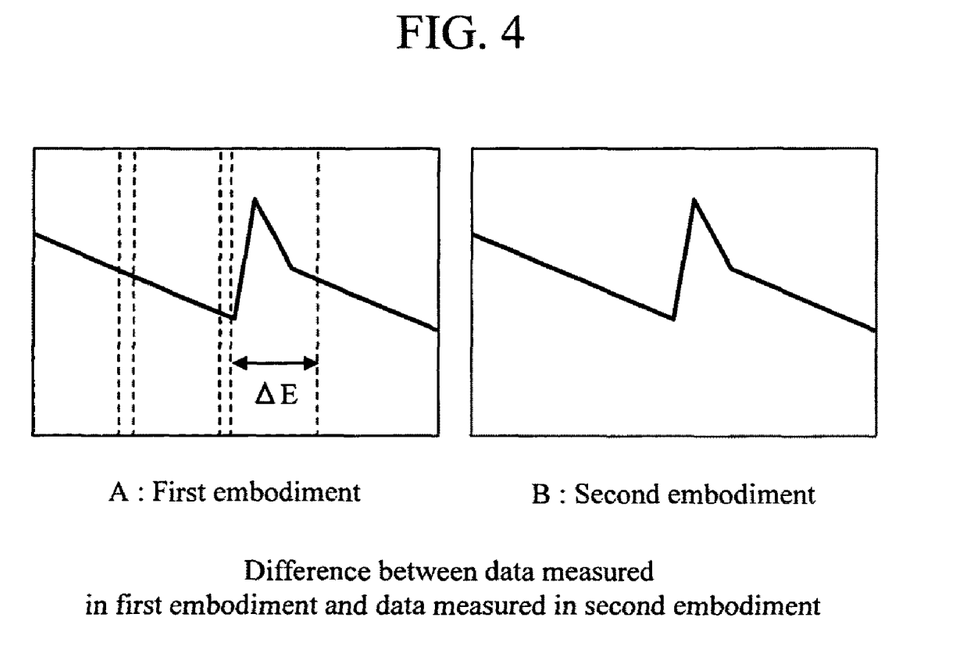
FIG. 4 is a diagram for explaining a difference between data measured in the first embodiment and data measured in the second embodiment.

In the first embodiment, energy filter images are obtained and an element image is obtained by using the three sorts of filter images (F1 to F3) (see FIG. 3). In the second embodiment, data from which an element image is obtained by the electron beam energy analyzer (EELS) 22 is not the energy filter images. That is, an EELS spectrum itself is first obtained and the background is extrapolated from the spectrum data to obtain the intensity of the core loss. The EELS spectrum in the second embodiment is a detailed one such that a spectrum shape such as shown in FIG. 4B can be identified. A detailed spectrum is measured with respect to each pixel of an image. On the other hand, in the first embodiment, data in F1, F2, and F3 has a signal intensity through an energy width ($\Delta E$) (FIG. 4A) and a detailed spectrum is not measured.

In the first embodiment, energy filter images are measured and an EELS-based element image is obtained on the basis of the energy filter images. On the other hand, in the second embodiment, EELS spectra are measured and an EELS-based element image is obtained on the basis of the EELS spectra.

For example, if the electron beam detector 16 has N channels (N≧3), a portion thereof is used for obtaining one energy filter image and at least three energy filter images are obtained. On the other hand, EELS spectra are obtained by using all the N channels.

(2) Element Image Observation

Figure 5:
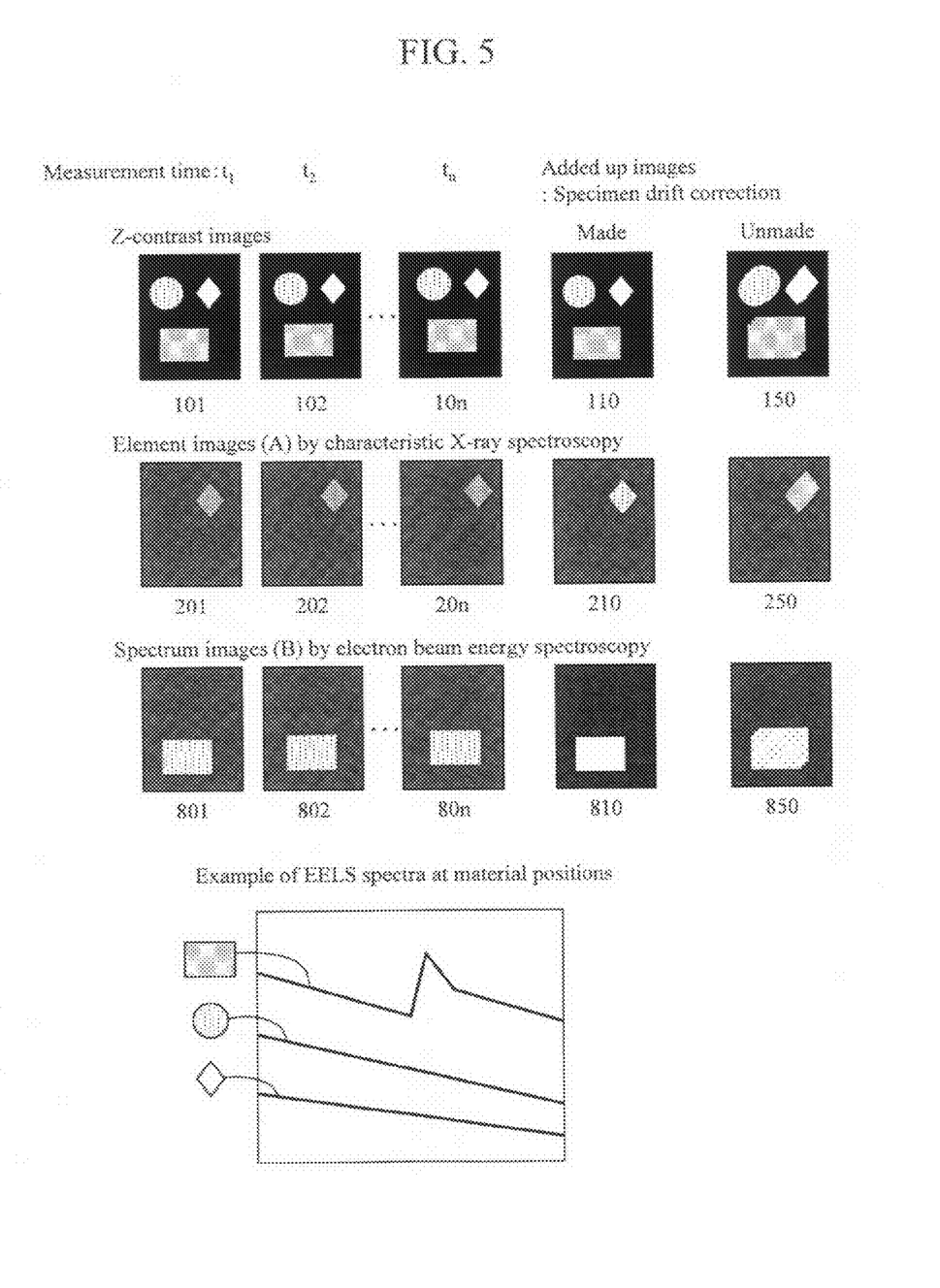
FIG. 5 is a diagram showing an example of observation of Z-contrast images, element images (A) based on characteristic X-ray spectroscopy and EELS spectrum images (B) based on electron beam energy spectroscopy and an example of EELS spectra from materials in the second embodiment.

FIG. 5 is a diagram for explaining a technique for element image observation according to the second embodiment of the present invention. Also in the second embodiment, in the same way as in the first embodiment, elastically scattered electrons from the specimen 5 are detected by the Z-contrast detector 9 in correspondence with the electron beam application position to form a Z-contrast image 101. Also, simultaneously with the Z-contrast image, an element image (A) 201 by the characteristic X-ray spectrometer and a group of EELS spectra by the electron beam energy analyzer are observed. These three sorts of signals are the results of image forming on the basis of detection of elastically scattered electrons and characteristic X-rays with the detectors performed when the electron beam is applied to one place on the specimen, and the results of detection of energy-loss electrons and forming of a group of EELS spectra. Therefore, the three sorts of signals represent the results with respect to the only one place. A combination of EELS spectra obtained by measuring an EELS spectrum at each electron beam application position and combining EELS spectra with respect to all the observation positions will be referred to as an EELS spectra group. Image forming is performed by using all the electron beam intensities of the EELS spectra at the electron beam application positions to obtain an EELS spectrum image.

A plurality of images are successively taken in the same way as in the above. The observed Z-contrast images are 102, . . . , 10n; the element images (A) are 202, . . . , 20n; and the EELS spectrum images (B) are 802, . . . , 80n. The total number n of images successively observed is not particularly specified. The number n is a number necessary for obtaining high S/N images.

If a specimen drift occurs while the images are being successively observed, the observed objects (represented by ○, ◊, and □ in FIG. 5) are shifted by small amounts, as shown in FIG. 2. If the images are added up without correcting the specimen drift, a failure to correctly observe the shape of the observed object, as shown by a Z-contrast image 150, results. Also, in an element image (A) 250 and an spectrum image (B) 850, the spatial resolution deteriorates.

Then, the images are added up after correcting the specimen drift, thereby enabling observation of a Z-contrast image 110, an element image (A) 210 and an EELS spectrum image (B) 810 at high resolution and a high S/N. To execute specimen drift correction, the amount of positional misalignment is computed by taking correlations on the basis of the Z-contrast images (101 to 10n), as described above with respect to the first embodiment. Specimen drift correction may be executed on the basis of the computed amount of positional misalignment. An element image can be obtained from the EELS spectrum image (B) 810 by subtracting a background signal from a core loss peak such as that in FIG. 4B appearing in the EELS spectrum with respect to the element to be observed.

Third Embodiment (1) Element Image Observation

Figure 6:
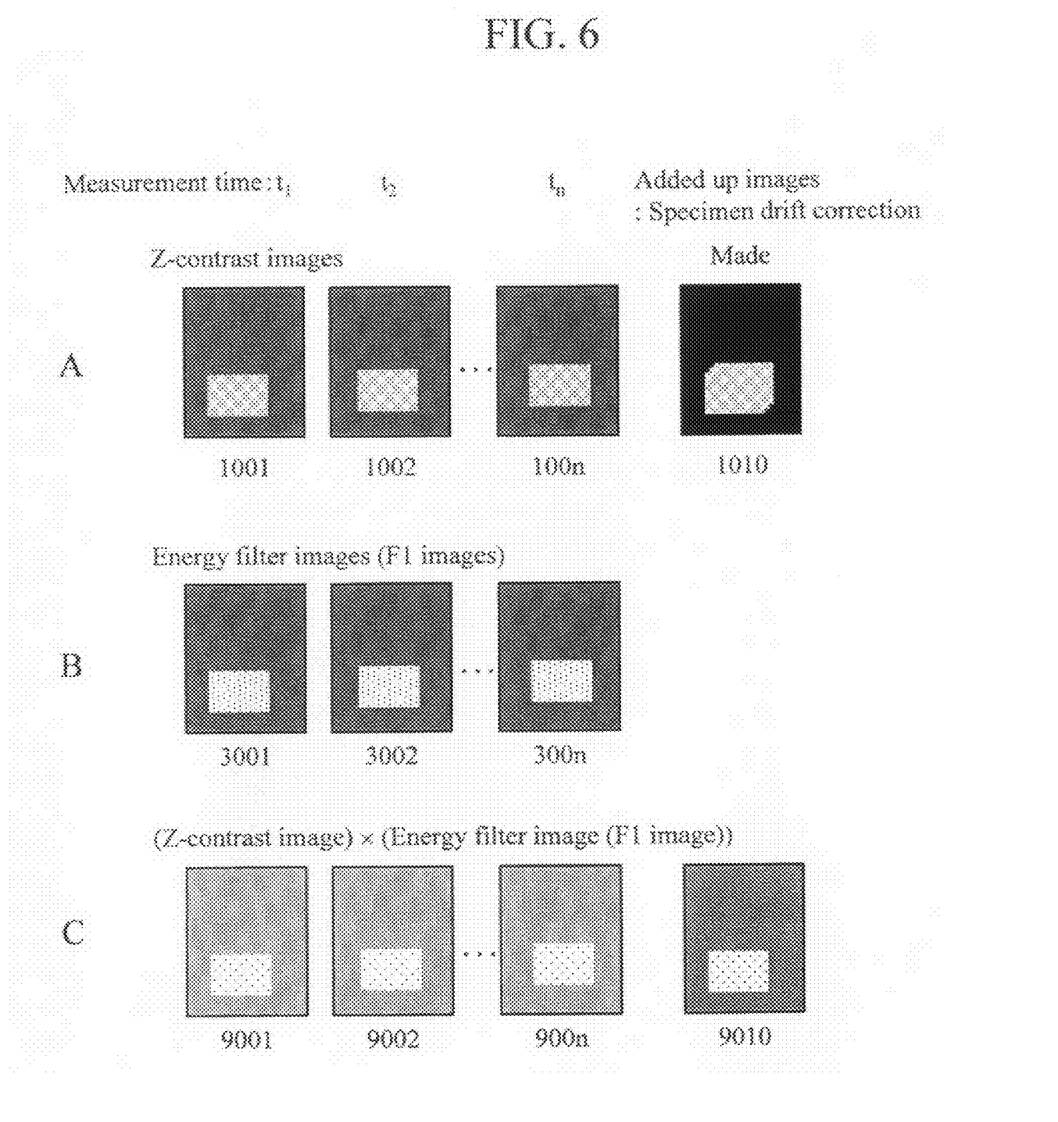
FIG. 6 is a diagram showing an example of observation of Z-contrast images, energy filter images (F1) and Z-contrast image×F1 image in the third embodiment.

FIG. 6 is a diagram for explaining a technique for element image observation according to the third embodiment of the present invention.

Also in the third embodiment, in the same way as in the first embodiment, elastically scattered electrons from the specimen 5 are detected by the Z-contrast detector 9 in correspondence with the electron beam application position to form a Z-contrast image 1001. Also, simultaneously with the Z-contrast image, an element image (A) by the characteristic X-ray spectrometer (see FIG. 2 because it is omitted in FIG. 6) and an energy filter image (F1) 3001 by the electron beam energy analyzer (see FIG. 2 because energy filter images (F2, F3) are omitted in FIG. 6) are observed. These five sorts of images are the results of image forming on the basis of detection of elastically scattered electrons, characteristic X-rays and energy loss electrons with the detectors performed when the electron beam is applied to one place on the specimen. Therefore, the five sorts of images represent the results with respect to the only one place.

A plurality of images are successively taken in the same way as in the above. The observed Z-contrast images are 1002, . . . , 100n, and the energy filter images by the electron beam energy analyzer are (F1) 3002, . . . 300n. Element images (A) and energy filter images (F2, F3) are omitted in FIG. 6. The total number n of images successively observed is not particularly specified. The number n is a number necessary for obtaining high S/N images.

In the example shown in FIG. 6, the S/N of Z-contrast images are low and a specimen drift cannot be corrected with sufficiently high accuracy. In the specimen shown in FIG. 6A, the differences between the electron densities in the materials are not substantially large and no difference in Z-contrast appears. On the other hand, a difference in contrast appears among energy filter images (e.g., F1), as shown in FIG. 6B, if the difference in nonelastic scattering sectional areas among the materials and/or the core loss intensity of the element to be analyzed is large.

In a case where the S/N of Z-contrast images are low as described above, image computation between the Z-contrast images and energy filter images, e.g., multiplication of between pixels in the same position may be performed to obtain a high-contrast image as multiplication image 9001, as shown in FIG. 6C. If the amount of positional misalignment of the specimen is computed by using the multiplication images 9001 to 900n and taking correlations, and if Z-contrast images, element images (A) and energy filter images are added up by using the amount of positional misalignment, a high-S/M image can be obtained.

(2) Meaning of Image Computation

In some case with some specimen, no difference in contrast appears in Z-contrast image. Even in such a case, there is a possibility of appearance of a difference in signal intensity between energy filter images.

Therefore, the third embodiment is effective in a case where a substantial difference in signal intensity appears between energy filter images while the difference in contrast between Z-contrast images is small. Also, an image in which the contrast is enhanced can be obtained by multiplying together a Z-contrast image and an energy filter image to perform specimen drift correction with improved accuracy.

Figure 7:
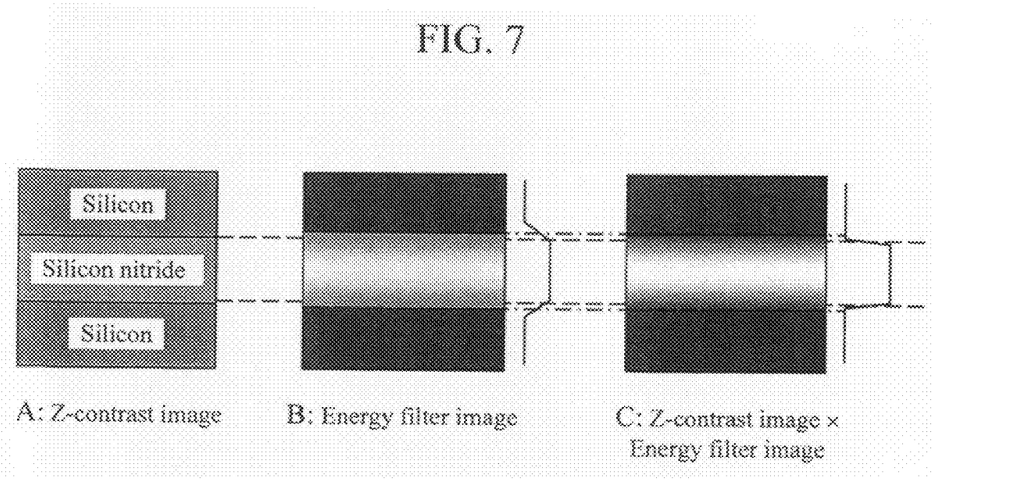
FIG. 7 is a diagram for comparison between a Z-contrast image, an energy filter image (F1) and a Z-contrast image×F1 image.

A specimen having silicon and silicon nitride for example will be considered. The difference in contrast between Z-contrast images of silicon and silicon nitride is small, as shown in FIG. 7A. Between energy filter images, however, a difference in intensity exists, such as shown in FIG. 7B.

In such a case, therefore, a specimen drift can be corrected by using energy filter images.

However, if the film thickness of silicon nitride film in on the 1 nm order, the film thickness may be observed as slightly wider due to a EELS physical phenomenon, depending on a measurement condition, and the interface may be observed as broadened, as shown in FIG. 7B.

Then, image computation as shown by (energy filter image)×(Z-contrast image) or (energy filter image)/(Z-contrast image) may be performed by using Z-contrast images having a small difference in contrast to form an image in which broadening of the interface between silicon and silicon nitride is limited, thus enabling specimen drift correction with higher accuracy.

SUMMARY

According to the present invention, an amount of specimen drift is obtained by computing correlations between a plurality of time-divided Z-contrast images (101 to 10n), and this amount of specimen drift is used to correct a specimen drift caused between a plurality of time-divided images obtained from a characteristic X-ray spectrometer and an electron beam energy analyzer. Since the amount of specimen drift is obtained by using the Z-contrast images higher in S/N than the other obtained images (in the same observation time) in the above-described way, the amount of specimen drift can be obtained with improved accuracy. Also, since the images are added up while correcting the amount of drift, there is no possibility of deterioration of the spatial resolution of element images and energy filter images.

If the S/N of the Z-contrast images is low, images having a large difference in contrast (a plurality of time-divided images) are obtained by performing image computation on the Z-contrast image and F1 images (multiplication or division between pixels), and the amount of specimen drift is computed by using the images. In this way, the amount of drift can be computed with improved accuracy in comparison with the case of computation using only the energy-filter images and Z-contrast images.

What is claimed is:

1. An electronic microscope apparatus for measuring an element image of a specimen, comprising:

an electron beam application section which applies to the specimen an electron beam generated in an electron beam source;

an elastically scattered electron detector which detects elastically scattered electrons transmitted through the specimen;

an electron beam energy analyzer which analyzes the energy of an electron beam of nonelastically scattered electrons transmitted through the specimen; and a controller which controls the electron beam application section, the elastically scattered electron detector and the electron beam energy analyzer to obtain an image relating to the specimen;

wherein the controller controls the electron beam application section so that the electron beam application section applies the electron beam to the same application position on the specimen for a predetermined time period, forms a plurality of time-divided elastically scattered electron images from the elastically scattered electrons detected by the elastically scattered electron detector, and forms, in a time division manner, on the basis of outputs from the electron beam energy analyzer, a plurality of first energy filter images including a core loss of the element to be observed, and at least two sorts of second and third energy filter images of lower-loss energy in comparison with the first energy filter images, and wherein the controller further computes an amount of specimen drift by using the plurality of elastically scattered electron images, corrects a specimen drift in the plurality of first to third energy filter images on the basis of the amount of specimen drift to add up the plurality of first to third energy filter images in each which the specimen drift has been corrected, and forms a first element image with respect to the element to be observed on the basis of the first to third energy filter images drift-corrected and added up.

2. The electronic microscope apparatus according to claim 1, wherein the controller forms the first element image by forming a background image using the second and third energy filter images drift-corrected and added up, and by subtracting the background image from the first energy filter images drift-corrected and added up.

3. The electronic microscope apparatus according to claim 1, wherein the controller forms the first element image by dividing the first energy filter images drift-corrected and added up by the second energy filter images drift-corrected and added up.

4. The electronic microscope apparatus according to any one of claims 1 to 3, further comprising a characteristic X-ray spectrometer which detects a characteristic X-ray spectrum generated from the specimen by application of the electron beam, and which outputs a characteristic X-ray signal, wherein the controller forms a plurality of time-divided second element images from the characteristic X-ray signal, and forms a second element image of a high S/N by correcting a specimen drift in the plurality of second element images on the basis of the amount of specimen drift computed to add up the second element images in each which the specimen drift has been corrected.

5. An electronic microscope apparatus for measuring an element image of a specimen, comprising:
- an electron beam application section which applies to the specimen an electron beam generated in an electron beam source;
- an elastically scattered electron detector which detects elastically scattered electrons transmitted through the specimen;
- an electron beam energy analyzer which analyzes the energy of an electron beam of nonelastically scattered electrons transmitted through the specimen, and which outputs an electron beam energy loss spectrum signal with respect to the nonelastically scattered electrons; and
- a controller which controls the electron beam application section, the elastically scattered electron detector and the electron beam energy analyzer to obtain an image relating to the specimen;
- wherein the controller controls the electron beam application section so that the electron beam application section applies the electron beam to the same application position on the specimen for a predetermined time period, and forms a plurality of time-divided elastically scattered electron images from the elastically scattered electrons detected by the elastically scattered electron detector, and a plurality of the time-divided electron beam energy loss spectrum signals on the basis of the electron beam energy loss spectrum signal from the electron beam energy analyzer, and
- wherein the controller further computes an amount of specimen drift by using the plurality of elastically scattered electron images, corrects a specimen drift in the electron beam energy loss spectrum signals on the basis of the amount of specimen drift to add up the plurality of elastically scattered electron images in each which the specimen drift has been corrected, and forms a first element image of a high S/N with respect to the element to be observed on the basis of the electron beam energy loss spectrum signals.

6. The electronic microscope apparatus according to claim 5, further comprising a characteristic X-ray spectrometer which detects characteristic X-ray spectrum generated from the specimen by application of the electron beam, and which outputs a characteristic X-ray signal, wherein the controller forms a plurality of time-divided second element images from the characteristic X-ray signal with respect to the element to be observed, and forms a second element image of a high S/N by correcting a specimen drift in the plurality of second element images on the basis of the amount of specimen drift computed to add up the plurality of second element images in each which the specimen drift is corrected.

7. An electronic microscope apparatus for measuring an element image of a specimen, comprising:
- an electron beam application section which applies to the specimen an electron beam generated in an electron beam source;
- an elastically scattered electron detector which detects elastically scattered electrons transmitted through the specimen;
- an electron beam energy analyzer for analyzing the energy of an electron beam of nonelastically scattered electrons transmitted through the specimen; and
- a controller which controls the electron beam application section, the elastically scattered electron detector and the electron beam energy analyzer to obtain an image relating to the specimen;
- wherein the controller controls the electron beam application section so that the electron beam application section applies the electron beam to the same application position on the specimen for a predetermined time period, forms a plurality of time-divided elastically scattered electron images from the elastically scattered electrons detected by the elastically scattered electron detector, and forms, in a time division manner, on the basis of outputs from the electron beam energy analyzer, a plurality of first energy filter images including a core loss of the element to be observed, and at least two sorts of second and third energy filter images of lower-loss energy in comparison with the first energy filter images, and
- wherein the controller further performs image computation on the plurality of elastically scattered electron images and the plurality of first energy filter images at the same point in time, computes an amount of specimen drift by using a plurality of images obtained by the image computation, corrects a specimen drift in the plurality of first to third energy filter images on the basis of the amount of specimen drift to add up the plurality of first to third filter images in each which the specimen drift has been corrected, and forms a first element image with respect to the element to be observed on the basis of the first to third energy filter images drift-corrected and added up.

8. The electronic microscope apparatus according to claim 7, wherein the controller forms a background image by using the second and third energy filter images drift-corrected and added up, and forms the first element image by subtracting the background image from the first energy filter images drift-corrected and added up.

9. The electronic microscope apparatus according to claim 7, wherein the controller forms the first element image by dividing the first energy filter images drift-corrected and added up by the second energy filter images drift-corrected and added up.

10. The electronic microscope apparatus according to claim 1, wherein the controller forms a contrast image of a high S/N by adding up while correcting a specimen drift in the plurality of elastically scattered electron images on the basis of the amount of specimen drift computed.

11. The electronic microscope apparatus according to claim 5, wherein the controller forms a contrast image of a high S/N by adding up while correcting a specimen drift in the plurality of elastically scattered electron images on the basis of the amount of specimen drift computed.

12. The electronic microscope apparatus according to claim 7, wherein the controller forms a contrast image of a high S/N by adding up while correcting a specimen drift in the plurality of elastically scattered electron images on the basis of the amount of specimen drift computed.

13. The electronic microscope apparatus according to claim 1, further comprising a characteristic X-ray spectrometer which detects a characteristic X-ray spectrum generated from the specimen by application of the electron beam, and which outputs a characteristic X-ray signal, wherein the controller forms a plurality of time-divided second element images from the characteristic X-ray signal, and forms a second element image of a high S/N by adding up while correcting a specimen drift in the plurality of second element images on the basis of the amount of specimen drift computed.

14. The electronic microscope apparatus according to claim 5, further comprising a characteristic X-ray spectrometer which detects a characteristic X-ray spectrum generated from the specimen by application of the electron beam, and which outputs a characteristic X-ray signal, wherein the controller forms a plurality of time-divided second element images from the characteristic X-ray signal, and forms a second element image of a high S/N by adding up while correcting a specimen drift in the plurality of second element images on the basis of the amount of specimen drift computed.

15. The electronic microscope apparatus according to claim 7, further comprising a characteristic X-ray spectrometer which detects a characteristic X-ray spectrum generated from the specimen by application of the electron beam, and which outputs a characteristic X-ray signal, wherein the controller forms a plurality of time-divided second element images from the characteristic X-ray signal, and forms a second element image of a high S/N by adding up while correcting a specimen drift in the plurality of second element images on the basis of the amount of specimen drift computed.

* * * * *